(12) United States Patent
Laitinen

(10) Patent No.: US 8,710,885 B2
(45) Date of Patent: Apr. 29, 2014

(54) METHOD AND ARRANGEMENT FOR CONTROLLING SEMICONDUCTOR COMPONENT

(75) Inventor: Matti Laitinen, Kirkkonummi (FI)

(73) Assignee: ABB Oy, Helsinki (FI)

( * ) Notice: Subject to any disclaimer, the term of this patent is extended or adjusted under 35 U.S.C. 154(b) by 148 days.

(21) Appl. No.: 12/579,907

(22) Filed: Oct. 15, 2009

(65) Prior Publication Data

US 2010/0097121 A1  Apr. 22, 2010

(30) Foreign Application Priority Data

Oct. 17, 2008  (EP) ..................................... 08166883

(51) Int. Cl.
*H03K 17/687* (2006.01)
*H03K 17/06* (2006.01)

(52) U.S. Cl.
CPC .................................. *H03K 17/063* (2013.01)
USPC ........................................................ 327/172

(58) Field of Classification Search
USPC ................. 327/108–112, 365, 374–377, 389, 327/427–432, 170, 172–176, 379, 391, 327/434; 326/21, 82–84, 89, 22–27; 365/230.06
See application file for complete search history.

(56) References Cited

U.S. PATENT DOCUMENTS

| 4,864,165 | A | * | 9/1989 | Hoberman et al. | ............. 326/16 |
| 5,689,394 | A | | 11/1997 | Esser et al. | |
| 6,005,377 | A | | 12/1999 | Chen et al. | |
| 6,954,054 | B2 | * | 10/2005 | Brown | ........................... 323/283 |
| 7,274,243 | B2 | | 9/2007 | Pace et al. | |
| 2003/0164721 | A1 | * | 9/2003 | Reichard | ........................ 327/108 |
| 2005/0083025 | A1 | | 4/2005 | Brown | |
| 2006/0181905 | A1 | * | 8/2006 | Summer | ..................... 363/21.12 |
| 2008/0007318 | A1 | | 1/2008 | Pace et al. | |
| 2008/0204087 | A1 | | 8/2008 | Schwarzer | |

FOREIGN PATENT DOCUMENTS

| CN | 101088221 | 12/2007 |
| DE | 10 2007 009 734 B3 | 6/2008 |
| GB | 2 440 771 A | 2/2008 |
| WO | WO 2005/104743 | 11/2005 |

OTHER PUBLICATIONS

European Search Report dated Mar. 10, 2009.
An English Translation of the Notification of First Office Action dated Aug. 24, 2011, issued in the corresponding Chinese Patent Application No. 200910178328.1.

* cited by examiner

*Primary Examiner* — Sibin Chen
(74) *Attorney, Agent, or Firm* — Buchanan Ingersoll & Rooney PC

(57) ABSTRACT

A method is disclosed for controlling a semiconductor component which includes a voltage controlled gate. The method includes determining and storing, prior to use of the semiconductor component, reference values of a gate voltage to be given to the gate of the semiconductor component during a change of operating states. The method also includes providing a pulse width modulated voltage from a driver circuit to a resistor connected to the gate of the semiconductor component according to the stored reference values of the gate voltage when a change in operating states of the semiconductor component is desired.

9 Claims, 2 Drawing Sheets

METHOD AND ARRANGEMENT FOR CONTROLLING SEMICONDUCTOR COMPONENT

FIELD OF THE INVENTION

The present invention relates to controlling of a gate controlled semiconductor component.

BACKGROUND OF THE INVENTION

Gate controlled semiconductor components, such as normally off devices like MOSFETs (Metal-Oxide-Semiconductor Field-Effect Transistor) and IGBTs (Insulated-Gate Bipolar Transistor), or normally on devices like JFETs (Junction-gate Field-Effect Transistor), are commonly controlled by applying DC voltages to the gate. When a normally off device is used as a switch, turn-on of the component is accomplished by setting a gate electrode of the component to a positive voltage with respect to an emitter/source electrode. Similarly, when the component is turned off, a negative voltage with respect to the emitter/source is applied to the gate. For a normally on device like JFET, either a positive (P-type JFET) or a negative (n-type JFET) biased gate to source voltage is applied to turn off the device. Sometimes an opposite polarity gate voltage is used in on state to enhance the conductivity of the channel.

The above switching is carried out with a drive circuit. The drive circuit receives a switching command from a control circuitry or the like, which determines when the switch should be operated. The drive circuit further receives the above-mentioned positive auxiliary voltage Vcc and negative auxiliary voltage Vee. The zero voltage point between the auxiliary voltages is connected to the emitter/source of the controlled semiconductor component. The typical drive circuits thus drive the semiconductor component in response to the switching command by changing the potential of the gate with respect to the emitter/source of the component. When turn-on e.g. of an IGBT is commanded, the drive circuit applies positive auxiliary voltage Vcc to the gate, thereby making the gate-to-emitter potential to Vcc. Similarly, when the component is to be turned off, voltage Vee is switched to the gate and the gate-to-emitter voltage is made to be –Vee turning the component off. A series resistance, often called gate resistance, is connected between the voltage sources and the gate to limit the gate current to values safe for the drive circuit. A minimum value of the gate resistor is often given by the component manufacturer. This value reflects the fastest switching speed the component withstands without destruction and thus gives the lowest switching losses. In practice, it is common that a much higher value of gate resistor is needed to limit the RFI emissions caused by the high voltage and current change rates. This, is turn, creates high switching losses and lower efficiency of the equipment.

To achieve a better and more reliable control of the switching phenomena, the gate voltages are often made asymmetrical. Typical values in connection with IGBTs for positive and negative auxiliary voltages are +15 volts and –7 volts, respectively.

BRIEF DESCRIPTION OF THE INVENTION

An object of the present invention is thus to provide a method and an arrangement for implementing the method so as to solve the above problem. The objects of the invention are achieved by a method and an arrangement which are characterized by what is stated in the independent claims. Preferred embodiments of the invention are disclosed in the dependent claims.

The invention is based on the idea of controlling the semiconductor component more accurately with specifically selected gate voltages applied to the gate. In the invention, the gate voltage is changed during a change of operating states based on pre-determined voltages, thus at each instant a voltage is generated to the gate that has the optimum value, depending on the need of the component. The variations in the gate voltage are obtained by using a pulse width modulation, in which the positive and negative auxiliary voltages are switched to the gate of the component repeatedly and the effective voltage in the gate is determined from the ratio of the pulses.

An advantage of the present invention is that the semiconductor component is controlled optimally to obtain minimal losses in the component. When the component is controlled according to the invention, also EMC disturbances are reduced since the voltage and current change rates may be controlled separately and optimally. Further, the semiconductor component is fully controlled, enabling improved controllability also in fault situations. The controllability also means that the turn-on or turn-off times can be made longer, if that is desired for some application. With the present invention, the auxiliary voltages can be symmetric since the pulse width modulation allows the turn-off voltage to be controlled.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

Figure 1:
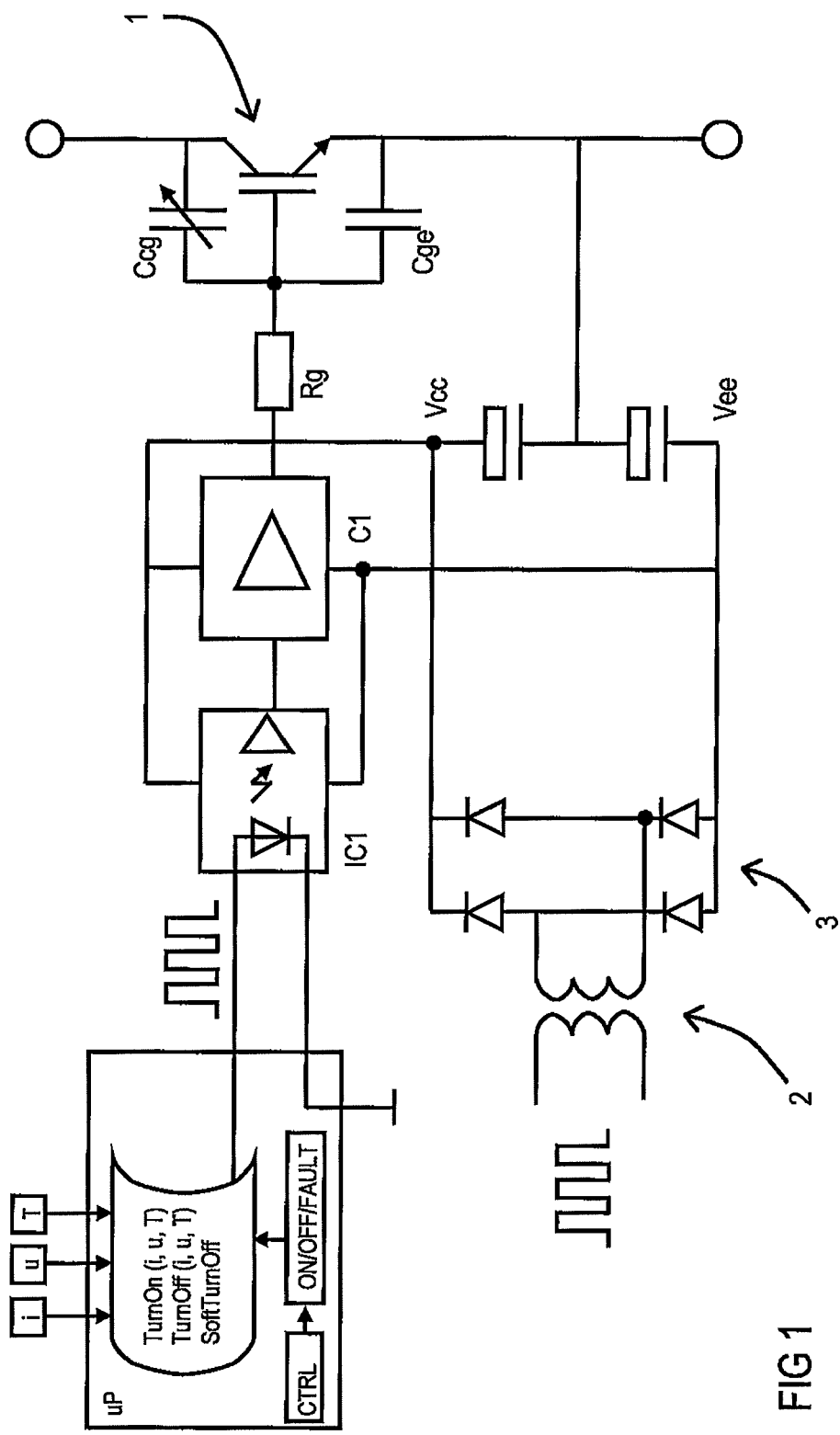
FIG. 1 illustrates an embodiment of the present invention.

FIG. 1 shows a circuit diagram of an embodiment of the present invention. In FIG. 1, the gate controlled semiconductor component is an IGBT 1. In connection with the IGBT, parasitic capacitances Ccg and Cge of the component are also illustrated, the Ccg being the capacitance between collector and gate and Cge being the capacitance between gate and emitter terminals. The capacitance Ccg has a variable nature, as shown by the drawing symbol. A gate resistance Rg is connected to the gate of the IGBT in a known manner.

FIG. 1 also shows auxiliary voltages Vcc and Vee, which are produced with a pulse transformer 2 from a pulsed signal. The secondary of the pulse transformer has a diode rectifier for rectifying the voltage from the secondary and a series connection of capacitors. The mid-point of the series connection is connected to the emitter of the IGBT. The voltage over the upper capacitor is the positive auxiliary voltage Vcc that is referenced to the emitter and the voltage over the lower capacitor forms the negative auxiliary voltage Vee referenced to the emitter. These auxiliary voltages can also be produced by a so called bootstrap method.

These auxiliary voltages are fed to a drive circuit C1 and to an integrated circuit IC1 for operation voltages. The drive circuit C1, which is basically an amplifier circuit, amplifies pulses received from the integrated circuit IC1. The integrated circuit IC1 produces galvanic separation between a microprocessor uP and the drive circuit C1. In other words, the microprocessor uP produces a signal which is galvanically separated and further amplified and fed to the gate of the IGBT through the gate resistor Rg. If the uP is in the emitter potential of the IGBT, the IC1 may be omitted.

In the present invention, prior to the use of the semiconductor component, reference values for gate voltage are determined and stored. These reference values are determined and stored at least for changes of operating states, such as for turn-on and turn-off procedures, but additionally special cases like soft turn-off in case of failure may be stored. These reference values represent the optimal way of changing operation states and, in the embodiment of FIG. 1, the values are stored in the database labelled TurnOn (I, u, T), TurnOff (I, u, T), SoftTurnOff. In the embodiment of FIG. 1, the reference values are determined and stored as a function of the current, voltage and temperature of the semiconductor component.

Based on the control algorithm, and measured or estimated data, the microprocessor uP of FIG. 1 creates a control signal in block "CTRL". This control signal determines that the semiconductor component in question should change its state. Depending on whether the signal from block "CTRL" is On or Off or if an indication of fault is pending, block "ON/OFF/FAULT" enables suitable stored data from the database. The most recently measured or estimated actual values i, u, T are used for selecting the best suitable gate voltage waveform. The actual values used may be switched current, switched voltage or component temperature or any combination thereof. The switched current refers to the value of phase current prior to switching, which will after the switching either flow through the component (turn-on) or be blocked from the component (turn-off). Similarly, the switched voltage refers to voltage that is switched with the component, and its magnitude is typically equal to the voltage of the intermediate circuit. The values of voltage and current are usually readily available from the control system and can be used in connection with the present invention.

According to the present invention, a pulse width modulated voltage is outputted from the drive circuit and fed to the gate resistor Rg connected to the gate of the controlled component. The pulse ratio of the pulse width modulated voltage depends on the stored reference values of the gate voltage. In the circuit of FIG. 1, based on turn-on or turn-off command, the stored reference values are read from the memory by the microprocessor uP as a function of the measured or predicted actual values. The database, which is in the memory, is in FIG. 1 shown to be situated in the microprocessor. However, the memory may be situated outside the microprocessor and the requirement is that the microprocessor can access the memory and read the data stored therein.

The microprocessor uP forms and outputs a pulse width modulated signal on the basis of the reference value. This PWM signal has a lower amplitude than the actual gate control voltage, but the voltages inside the microprocessor are scaled so that the pulse pattern of the PWM signal is as desired. When this pulse pattern is further galvanically separated and amplified with the driver circuit C1, the voltage applied to the gate resistor equals the reference voltage. It is to be noted that a PWM signal is formed of two voltage levels. The durations of consecutive voltages pulses in a PWM voltage determine the average voltage, which is made to be equal to the desired voltage in one control or modulation period.

In the present invention, the pulse width modulated voltage is applied to the gate resistor, which is connected to the gate of the semiconductor component. The gate resistor Rg together with the parasitic capacitances Ccg and Cge form a low-pass filter which filters the PWM pulses. The gate of the semiconductor component thus receives a low-pass filtered PWM signal, which corresponds to the reference value for gate voltage. The formed low-pass filter filters out the PWM signal, resulting in a substantially even voltage at the gate.

In the invention, the reference values for gate voltage are preferably stored directly as pulse ratios. When a change of operation states is desired, the microprocessor outputs a pulse width modulated signal whose the pulse ratio can be directly read from a table according to a measured or estimated current, voltage and/or temperature. Preferably, the stored data is gathered as a function of current, voltage and temperature. However, the data may also be stored only as a function of current and voltage. Also, even if the data is stored as a function of current, voltage and temperature, the database may be used only with measured or estimated current and voltage.

To optimize the switching, the stored pulse ratios are assigned to specific time intervals, i.e. for example time interval t0 to t1, pulse ratio 0.95; time interval t1 to t2, pulse ratio 0.50; time interval t2 to t3, pulse ratio 0.8, etc. In the preferred embodiment of the invention, the data is stored for each combination of switched current, switched voltage and temperature. In order to keep the size of the database reasonable, the data is stored in discrete steps or intervals. When the database is indexed, the closest matching point is selected for providing the pulse ratios and durations.

As mentioned above, values are stored for both turn-on and turn-off procedures. Further, the stored reference values of the gate voltage may include reference values for fault situations for controlling the component safely to a non-conducting state. This is indicated in FIG. 1 as a FAULT output from the CTRL block and a "Soft TurnOff" alternative in the data store.

Other stored values may include saturation control voltage with which the saturation of the semiconductor component is controlled to a desired level. The stored values are not restricted to the above mentioned ones, and the method and arrangement of the invention can be used in any purpose for controlling the gate voltage of a semiconductor component accurately.

The present invention requires that the gate driver should be able to forward pulses which are of tens of nanoseconds. This is possible with fast optocouplers, such as ACPL072L by Avago, or with fast digital isolators, such as ADUM1100 by Analog Devices or ISO721 by Texas Instruments.

Figure 2:
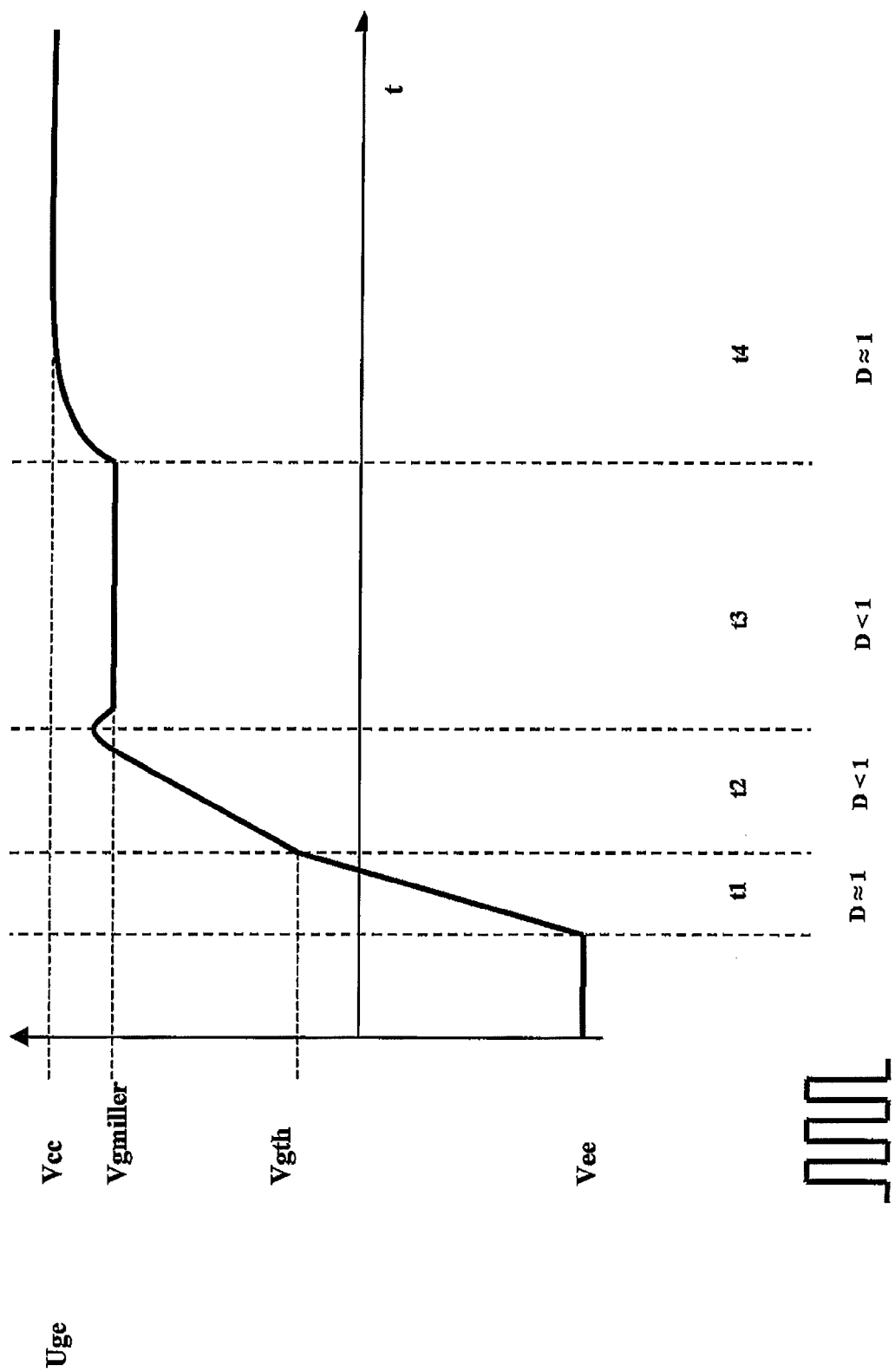
FIG. 2 shows a graph of gate voltage during turn-on of an IGBT.

FIG. 2 shows an example of the gate-to-emitter voltage during turn-on of an IGBT when the load of the component is inductive. During time period t1 the gate voltage is raised from a negative auxiliary voltage to Vgth, which is the turn-on threshold voltage. During period t1 the collector current and collector-to-emitter voltage does not change and this period is to be minimized to shorten a turn-on delay. FIG. 1 also shows a pulse ratio D to be applied to the gate resistor of the component. The pulse ratio D is defined as D=tccT, where tcc is the time for the duration of which voltage is Vcc, i.e. up, during a time period T. As can be seen, D is substantially 1 during period t1.

During time period t2, the current of the IGBT follows the gate voltage in a manner determined by transconductance. In the plot of FIG. 2, the gate voltage overshoot required by the current tailing of a diode connected to an opposing branch in an inverter circuit is assumed. During this time, it is desirable to control di/dt i.e. the current change rate. The value for D is kept below 1 during period t2.

In time period t3, the gate current charges the variable capacitance Ccg. During this period, the gate voltage stays at a value Vgmiller, which depends on the component current. During time period t3, the decrease rate of the collector-toemitter voltage can be controlled with the gate voltage. The pulse ratio in period t3 is kept below value 1. The total gate charge during this period is a function of the switched voltage, and thus the measured or estimated voltage can be used to estimate the time period.

During time period t4, the gate voltage rises to a full positive auxiliary voltage Vcc, and it is again desirable to minimize this period, and thus D is substantially 1.

In FIG. 2, no exact values for D or the time periods are given. This is due to the fact that each type of component requires specific control. It should also be noted that while the operation in FIG. 2 is divided into four periods, it does not mean that the pulse ratio is constant within each period.

Since the control of the semiconductor component is tabled as explained above, the control voltage can be easily varied.

A PWM signal is produced in the FIG. 1 by digital means. Such a PWM signal can, however, be construed in a well known manner by comparing a voltage level with a triangle wave. In such a case, the voltage level is the reference value of the gate voltage scaled to have the same amplitude as the triangular wave.

Above, only transient states, i.e. changes of operation states of the semiconductor component, are dealt with. It is, however, clear that the method and arrangement of the invention provide suitable gate voltages also when the controlled component is in a steady state, i.e. turned on or turned off.

In the present invention, the member producing the pulse width modulated signal is above referred to as a microprocessor. A microprocessor is a suitable member, but it should be understood that the same functions can be carried out with different components and members.

It will be obvious to a person skilled in the art that as technology advances, the inventive concept can be implemented in various ways. The invention and its embodiments are not limited to the examples described above but may vary within the scope of the claims.

The invention claimed is:

1. A method of controlling a semiconductor component which includes a voltage controlled gate, wherein the method comprises
   determining and storing, prior to use of the semiconductor component, reference values of a gate voltage to be applied to the voltage controlled gate of the semiconductor component during a change of operating states and as a function of switched current, switched voltage, and temperature of the semiconductor component;
   measuring or estimating the switched current, the switched voltage, and the temperature of the semiconductor component; and
   providing a pulse width modulated voltage from a driver circuit to a resistor connected to the voltage controlled gate of the semiconductor component according to the reference values of the gate voltage determined as a function of the measured or estimated switched current, switched voltage, and temperature when the change in operating states of the semiconductor component is desired.

2. The method as claimed in claim 1, wherein the reference values of the gate voltage are stored as pulse ratios.

3. The method as claimed in claim 1, wherein the reference values comprise durations of multiple time periods and pulse ratios used during the time periods.

4. The method as claimed in claim 1, wherein the reference values comprise durations of multiple time periods and pulse ratios used during the time periods.

5. The method as claimed in claim 1, wherein the durations of consecutive voltage pulses in the pulse width modulated voltage determine the average voltage, which is made equal to a desired voltage in a control period.

6. A control arrangement for controlling a semiconductor component having a voltage controlled gate, the arrangement comprising:
   means for storing reference values of a gate voltage to be applied to the voltage controlled gate of the semiconductor component during a change of operating states, which values are determined prior to use of the semiconductor component;
   means for providing a pulse width modulated signal based on the reference values of the gate voltage;
   a resistive element connected to the voltage controlled gate of the semiconductor component;
   a driver circuit for supplying a pulse width modulated voltage according to the pulse width modulated signal to the resistive element connected to the voltage controlled gate of the semiconductor component when the change of operating states of the semiconductor component is desired, wherein the driver circuit comprises:
      means for providing galvanic separation for the pulse width modulated signal; and
      an amplification circuit for amplifying the pulse width modulated signal and for providing a pulse width modulated voltage according to the reference values of the gate voltage.

7. The control arrangement as claimed in claim 6, wherein:
   the means for providing a pulse width modulated signal is a microprocessor; and
   the means for storing reference values of the gate voltage are memory means from which the microprocessor can read stored data.

8. The control arrangement as claimed in claim 7, wherein the driver circuit comprises:
   means for providing galvanic separation for the pulse width modulated signal; and
   an amplification circuit for amplifying the pulse width modulated signal and for providing a pulse width modulated voltage according to the reference values of the gate voltage.

9. The control arrangement as claimed in claim 6, wherein the durations of consecutive voltage pulses in the pulse width modulated voltage determine the average voltage, which is made equal to a desired voltage in a control period.

* * * * *